United States Patent [19]
Linder
[11] 3,825,849
[45] July 23, 1974

[54] SMALL SIGNAL AMPLIFIER

[75] Inventor: Donald L. Linder, Elmhurst, Ill.
[73] Assignee: Motorola, Inc., Franklin Park, Ill.

[22] Filed: July 12, 1972
[21] Appl. No.: 270,902

[52] U.S. Cl. ........ 330/17, 330/20, 330/22, 330/28, 330/32
[51] Int. Cl. ........ H03f 3/18
[58] Field of Search ........ 330/17, 22, 28, 20, 24, 330/32, 38 M, 92

[56] References Cited

UNITED STATES PATENTS

| | | | |
|---|---|---|---|
| 2,874,232 | 2/1959 | Jochems | 330/17 UX |
| 3,244,996 | 4/1966 | Ott | 330/17 X |
| 3,466,390 | 9/1969 | Inamiya et al. | 330/17 UX |
| 3,531,730 | 9/1970 | Steckler | 330/38 M X |
| 3,622,900 | 11/1971 | Hanus et al. | 330/38 M X |

OTHER PUBLICATIONS

"Semiconductor Products," September/October 1958, pp. 22,23.
Parmer, "Two Easy Ways To Stabilize Power-Transistor Hi-Fi Amplifiers," Electronics, Oct. 26, 1962, pp. 56,57.
Riordan, "The Mixed Double: A New Balanced Input Stage," Electronics Letters, Aug. 12, 1971, p. 454.

*Primary Examiner*—Herman Karl Saalbach
*Assistant Examiner*—James B. Mullins
*Attorney, Agent, or Firm*—Eugene A. Parsons; Vincent J. Rauner

[57] ABSTRACT

A transistor amplifier stage followed by an emitter follower stage with the emitter follower providing an output and feedback to the base of the amplifier stage and an opposite conductivity type transistor connected between the base and common. A microphone or other small signal generating device providing an AC or DC signal is connected between the base and common of the transistor so that the transistor operates as a variable conductivity diode with the conductivity varying in accordance with the small signal input. Thus the microphone is direct coupled to the amplifier and the small signal varies about the common or ground potential with the feedback maintaining the entire circuit at a desired operating point.

8 Claims, 2 Drawing Figures

PATENTED JUL 2 3 1974 3,825,849

SMALL SIGNAL AMPLIFIER

BACKGROUND OF THE INVENTION

1. Field of the Invention

The present invention pertains to an improved small signal amplifier which can be easily incorporated in an integrated circuit and which may be direct coupled to small signal devices providing either AC or DC signals, such as microphones, discriminator outputs, level translators and the like. At the present time it is highly desirable to incorporate preamplifier circuits into integrated circuits or to be able to make separate integrated circuits for the preamplifiers so that they can be easily included in the associated apparatus, such as the microphone or the like.

2. Description of the Prior Art

Prior art small signal amplifiers generally are connected to a small signal generating device, such as a microphone or the like, by means of capacitors. In the event the signal applied to the amplifier is DC, or a DC signal varying about a reference point such as ground, the associated circuitry is relatively complicated and generally includes components such as FET's, or positive and negative power supplies. These components greatly increase the cost and size of the apparatus, as well as the complexity. Further, the prior art circuits are generally sensitive to small changes in component values, due to replacement of components, changes in operating temperatures, etc. Because of the capacitor coupling of the positive and negative power supplies it is very difficult to incorporate the prior art circuits into integrated circuits and, further, to prevent prior art circuits from being dependent upon ambient conditions it is necessary to make the circuits relatively complex.

SUMMARY OF THE INVENTION

The present invention pertains to an improved small signal amplifier including amplifying means with at least one semiconductor device and an emitter follower output stage connected thereto, a semiconductor junction of an opposite conductivity type from the semiconductor device connected to said semiconductor device and responsive to small signals applied thereto to alter the base current of the semiconductor device in response to the small signals applied to the semiconductor junction, and feedback means supplying current from the emitter follower output to the semiconductor junction and the base of the semiconductor device to maintain the quiescent current thereof relatively constant regardless of changes in components.

It is an object of the present invention to provide an improved small signal amplifier.

It is a further object of the present invention to provide a small signal amplifier which is direct coupled to a small signal generating device, such as a microphone, discriminator, level translator, or the like.

It is a further object of the present invention to provide an improved small signal amplifier which is relatively unaffected by small changes in component value due to changes in ambient conditions, replacement of components, etc.

It is a further object of the present invention to provide a DC coupled amplifier that can accept input signals that vary negative as well as positive with respect to the circuit common terminal.

These and other objects of this invention will become apparent to those skilled in the art upon consideration of the accompanying specification, claims and drawing.

BRIEF DESCRIPTION OF THE DRAWING

Referring to the drawing.

DESCRIPTION OF THE PREFERRED EMBODIMENTS

Figure 1:
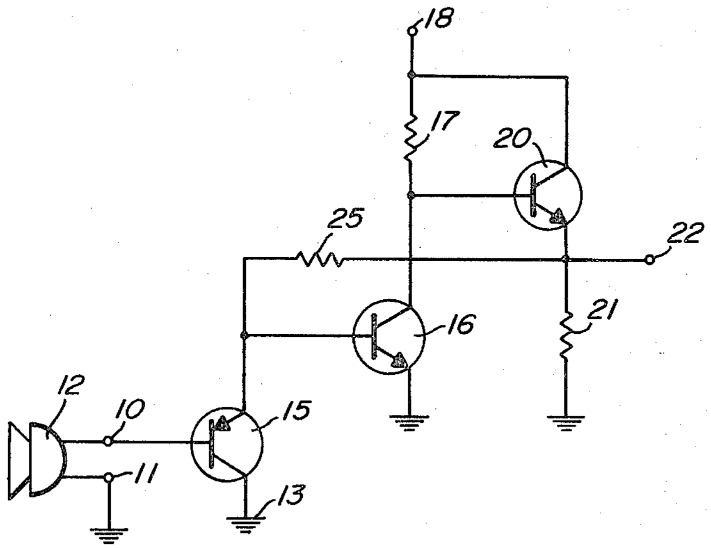
FIG. 1 is a schematic diagram of an embodiment of a small signal amplifier constructed according to the present invention.

A pair of terminals 10 and 11 are adapted to have connected thereto a small signal generating device, which in this embodiment is a microphone 12. The terminal 11 is connected to a common or ground 13 and the terminal 10 is connected to the base of a PNP type transistor 15. The collector of the transistor 15 is connected directly to the common 13 and the emitter is connected directly to the base of an NPN type transistor 16. The emitter of the transistor 16 is connected directly to the common 13 and the collector is connected through a resistor 17 to a suitable source of positive voltage 18. The collector of the transistor 16 is also connected to the base of an NPN type transistor 20, the collector of which is connected to the positive voltage supply 18. The emitter of the transistor 20 is connected through a resistor 21 to the common 13 and to an output terminal 22. The emitter of the transistor 20 is also connected through a feedback resistor 25 to the emitter of the transistor 15 and the base of the transistor 16.

The transistor 16 forms an amplifying stage, the output of which is applied to an emitter follower stage including transistor 20. The output from the emitter follower stage at output terminal 22 is fed back through the resistor 25 to supply current for operation of the transistor 15 and for base current for the transistor 16. In the design of the circuit transistors 15 and 16 are chosen so that the base to emitter voltage of transistor 15 is approximately equal to the base to emitter voltage of transistor 16 as some predetermined ratio of operating current. Then resistors 17 and 25 are chosen to provide an output voltage at terminal 22 approximately midway between the voltage at source 18 and the common 13 with the predetermined ratio of operating current flowing in transistors 15 and 16. Once the circuit has been designed normal unit to unit component variations will not substantially affect the bias conditions thereof. Therefore, any variation in circuit components caused by replacement of parts with slightly different parts or changes in ambient conditions will be compensated by the feedback current which will tend to maintain the quiescent and the DC operating levels approximately constant.

The microphone 12 has essentially a zero DC drop thereacross so that the base to collector junction of the transistor 15 has essentially a zero DC voltage drop thereacross, and the transistor 15 appears as a single emitter to base semiconductor junction connected across the base to emitter junction of the transistor 16. The conductance of the emitter to base junction of the transistor 15 is altered by the small AC signal applied to the base by the microphone 12. Also, if the microphone 12 is replaced with a discriminator, or the like, which provides a DC signal varying about ground as the reference potential, the conductance of the emitter to base junction of the transistor 15 is altered in accordance therewith. Thus, the conductance of the semiconductor junction varies in accordance with the small signal applied thereto. As the conductance of the emitter to base junction of the transistor 15 varies, the amount of current flowing therein varies and the amount of current available for the base of the transistor 16 varies. Thus, the base drive to the transistor 16 varies in accordance with the small signal supplied by the microphone 12.

Since the base of the transistor 15 is essentially at ground potential, the small signal varies about the common or ground potential in a slightly negative and positive direction. The signal will vary approximately equal amounts in the negative and positive direction unless it becomes sufficiently negative to back bias the base to collector junction of the transistor 15, which potential is around a −0.6 volts for silicon transistors. Because the signal varies about the common or ground potential, a small signal generating device, such as microphone 12, which is referred to ground can be connected directly to the base of the transistor 15. The elimination of the coupling capacitors greatly enhances the ability to integrate the circuits.

Figure 2:
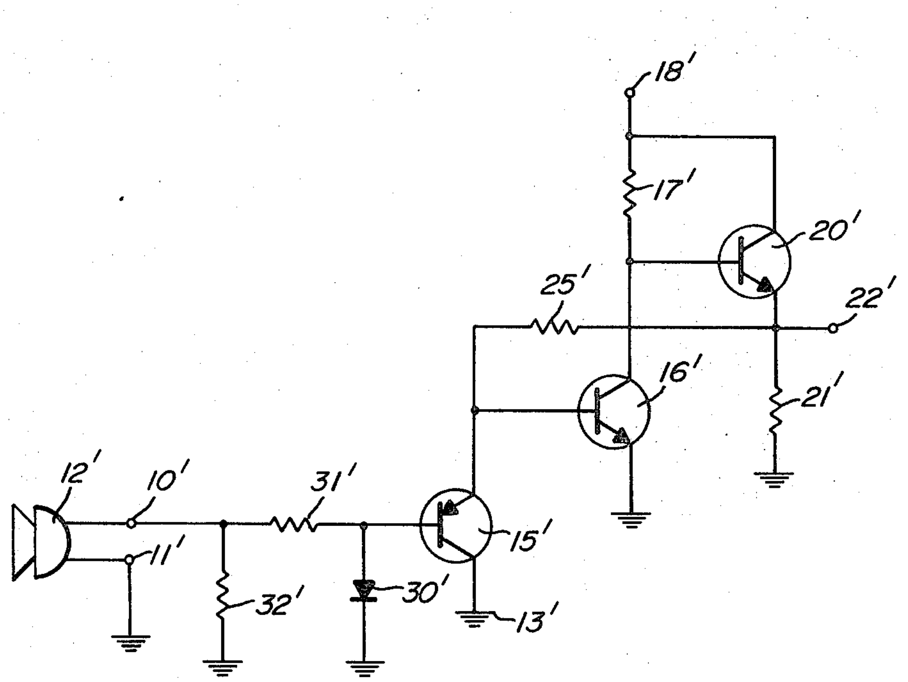
FIG. 2 is a schematic diagram of another embodiment of a small signal amplifier constructed according to the present invention.

Referring to FIG. 2, another embodiment of the small signal amplifier circuit is illustrated wherein similar parts are designated with similar numbers and all of the numbers have a prime (′) added thereto to indicate a different embodiment. In the circuit of FIG. 2, an amplifier stage includes an NPN type transistor 16′ having a collector connected to a suitable voltage source 18′ through a resistor 17′ and an emitter connected to common or ground 13′. An emitter follower stage includes an NPN type transistor 20′ having a base connected to the collector of the transistor 16′ and a collector connected to the voltage source 18′. The emitter of the transistor 20′ is connected to the common 13′ through a resistor 21′ and to the base of the transistor 16′ through a resistor 25′. The base of the transistor 16′ is also connected to the emitter of a PNP type transistor 15′, the collector of which is connected directly to the common 13′. The anode of a diode 30′ is connected to the base of the transistor 15′ and the cathode is connected to the common 13′. A resistor 31′ is connected between the base of the transistor 15′ and an input terminal 10′ and a resistor 32′ is connected between the input terminal 10′ and a common or grounded input terminal 11′. A small signal generating device, such as microphone 12′, is connected between the input terminals 10′ and 11′.

The operation of the circuit of FIG. 2 is substantially similar to the operation of the circuit in FIG. 1 except that diode 30′ and resistors 31′ and 32′ are placed between the microphone and the semiconductor junction to insure proper operation if a coupling capacitor is inadvertently used in the circuit. Diode 30′ is placed in parallel with the base to collector junction of the transistor 15′ to limit positive signals applied thereto. The base to collector junction of the transistor 15′ serves to limit the negative excursions of the signal so that both the negative and positive excursions are limited in the event the amplitude of the input signal is relatively large. The resistor 32′ is an impedance matching resistor. The resistor 31′ and the natural capacitance of the diode 30′ form a filter to reduce noise and other high frequency signals, such as RF, which appear thereacross.

Thus, a small signal amplifier is disclosed which can easily be incorporated into an integrated circuit and which can be direct coupled to a small signal generator, such as a microphone, discriminator, level translator, or the like to amplify AC or DC signals. Further the circuit is self-adjusting so that the operating characteristics are relatively stable in spite of small changes in component values, etc. While I have shown and described specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of the invention.

I claim:

1. An improved small signal amplifier comprising:

a. amplifying means including a first conductivity type semiconductor device having first, second and control electrodes and output means, said first electrode being direct current coupled to a reference potential;

b. a second conductivity type semiconductor device direct current coupled between the control electrode of said first conductivity type semiconductor device and said reference potential;

c. constant current means connecting said output means to said second conductivity type semiconductor device and the control electrode of said first conductivity type semiconductor device for supplying a substantially constant current thereto in a quiescent state; and d. direct current means coupled between said second conductivity type device and said reference potential for receiving a small signal varying about said reference potential and varying the current flowing through said second conductivity type semiconductor device and the conductivity thereof in response thereto, said coupled means and said second conductivity type semiconductor device being connected between the first and control electrodes of said first conductivity type semiconductor device for providing an alternate current path in parallel with the first and control electrodes of said first conductivity type semiconductor device to vary the amount of current being applied to the control electrode of said first conductivity type semiconductor device in response to the small signal applied to said second conductivity type device.

2. An improved small signal amplifier as set forth in claim 1 wherein the output means is a transistor connected in an emitter follower stage having a control electrode coupled to the output of the semiconductor device.

3. An improved small signal amplifier as set forth in claim 2 wherein the output of the amplifier is obtained from the emitter follower stage and the constant current means connecting the output means to the second conductivity type device includes a feedback resistor which applies the output to said second conductivity type device.

4. An improved small signal amplifier as set forth in claim 3 including in addition means biasing the second conductivity type semiconductor device and the first conductivity type semiconductor device for maintaining the output of the amplifier at a value approximately midway between common and supply potentials applied to the amplifier in a quiescent state.

5. An improved small signal amplifier as set forth in claim 4 wherein the second conductivity type semiconductor device is a PNP type transistor with the collector connected to a common terminal.

6. An improved small signal amplifier as set forth in claim 5 having in addition a small signal generating device connected directly between the collector and the base of the PNP type transistor.

7. An improved small signal amplifier as set forth in claim 6 wherein the small signal generating device includes a microphone.

8. An improved small signal amplifier comprising:

a. an amplifier stage including a first transistor having a first conductivity type with emitter, collector and control electrodes, said emitter electrode being direct current coupled to a reference potential;

b. an emitter follower stage coupled to receive the output of said amplifier stage at an input thereof and providing an output;

c. a second transistor having an opposite conductivity type with emitter, collector and control electrodes, said collector electrode being direct current coupled to the reference potential;

d. feedback means connecting the output of said emitter follower stage to the control electrode of said first transistor and to the emitter electrode of said second transistor for supplying operating current thereto; and e. small signal input means direct current coupled between the collector electrode and the control electrode of said second transistor for applying a small signal varying about the reference potential to vary the conductivity between the emitter electrode and the control electrode in response to small signal inputs to thereby vary the current flowing through said second transistor, the emitter and collector electrodes of said second transistor being direct current coupled between the control and emitter electrodes of said first transistor for varying the amount of current being applied to the control electrode of the first transistor in response to the small signal input.

* * * * *